United States Patent
Koike et al.

(10) Patent No.: US 7,053,455 B2
(45) Date of Patent: May 30, 2006

(54) SEMICONDUCTOR DEVICE AND METHOD OF MANUFACTURING SEMICONDUCTOR DEVICE

(75) Inventors: Masahiro Koike, Yokohama (JP); Masato Koyama, Miura-gun (JP); Tsunehiro Ino, Kawasaki (JP); Yuuichi Kamimuta, Yokohama (JP); Akira Takashima, Sagamihara (JP); Masamichi Suzuki, Yokohama (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 10/772,280

(22) Filed: Feb. 6, 2004

(65) Prior Publication Data

US 2004/0155353 A1 Aug. 12, 2004

(30) Foreign Application Priority Data

Feb. 7, 2003 (JP) ............................. 2003-031466

(51) Int. Cl.
*H01L 29/94* (2006.01)
*H01L 31/62* (2006.01)

(52) U.S. Cl. ...................... 257/411; 257/410; 257/761

(58) Field of Classification Search ................. 257/411, 257/410, 761
See application file for complete search history.

(56) References Cited

U.S. PATENT DOCUMENTS

2002/0098627 A1 * 7/2002 Pomarede et al. ........... 438/149
2002/0149065 A1 * 10/2002 Koyama et al. ............. 257/389
2004/0147101 A1 * 7/2004 Pomarede et al. ........... 438/591

FOREIGN PATENT DOCUMENTS

JP 2003-77911 3/2003

OTHER PUBLICATIONS

M. R. Visokay, et al., "Application Of HfSiON as a Gate Dielectric Material", Applied Physics Letters, vol. 80, No. 17, Apr. 29, 2002, pp. 3183-3185.

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

Disclosed is a semiconductor device comprising a substrate, an insulating film formed above the substrate and containing a metal, Si, N and O, the insulating film containing metal-N bonds larger than the sum total of metal-metal bonds and metal-Si bonds, and an electrode formed above the insulating film.

13 Claims, 5 Drawing Sheets

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2003-031466, filed Feb. 7, 2003, the entire contents of which are incorporated herein by reference.

BACKGROUND OF THE INVENTION

1. Field of the Invention

The present invention relates to a semiconductor device and a method for manufacturing the same, and more particularly, to a semiconductor device containing an insulating film having a high dielectric constant, and a method for manufacturing the same.

2. Description of the Related Art

Recently, as the next generation gate insulator replacing an silicon dioxide film ($SiO_2$ film), expectations for high dielectric films such as metal silicate films including an Hf silicate film (HfSiO film) have increased. Since the dielectric constant of the Hf silicate film is higher than that of an $SiO_2$ film, the equivalent oxide thickness (EOT) of the Hf silicate film can be reduced while keeping sufficient physical thickness to suppress leakage current.

To form an effectively thin gate insulator, the dielectric constant of the film is desirably as high as possible. Such a dielectric film can be attained by increasing the amount of Hf in the film. However, an excessively large amount of Hf is reported to cause phase separation and crystallization of a film, increasing leakage current.

To prevent the crystallization, use of an HfSiON film formed by adding N to an HfSiO film has been proposed (M. R. Visocay et al., Appli. Phys. Lett., 80, 3183 (2002)). According to the proposal, it is confirmed that when an HfSiO film and HfSiON film are heat-treated for 60 seconds in an $N_2$ atmosphere, the HfSiO film is crystallized at 1,000° C., whereas the HfSiO film remains in amorphous even at 1100° C.

However, as a result of our investigation, we have found that since an Hf—N bond is not present in the films formed by conventional methods, it is not easy to increase the concentrations of both Hf and N.

Therefore, the ratio (percentage) of Hf/(Hf+Si) of a conventional HfSiON film remains at most about 44%. Therefore, an HfSiON film having a high dielectric constant capable of suppressing crystallinity and leakage current has not yet been realized.

It has been confirmed that the HfSiON film formed by an on-axis sputtering method contains Hf—N bonds in an amount of less than 1%. Therefore, an HfSiON film containing a large amount of Hf cannot be obtained.

As described, it has been difficult to form an HfSiON film having a high dielectric constant, capable of suppressing crystallinity and leakage current.

Under the circumstances, the present invention is directed to providing a semiconductor device having an insulating film formed of a nitrogen-incorporated metal silicate film with a high dielectric constant, capable of reducing leakage current lower than an oxide film, and suppressing crystallinity and also directed to the method for manufacturing such a semiconductor device.

BRIEF SUMMARY OF THE INVENTION

According to one aspect of the present invention, there is provided a semiconductor device comprising: a substrate; an insulating film formed above the substrate and containing a metal, Si, N and O, the insulating film containing metal-N bonds larger than the sum total of metal-metal bonds and metal-Si bonds; and an electrode formed above the insulating film.

According to another aspect of the present invention, there is provided a semiconductor device comprising: a substrate; an insulating film formed above the substrate and containing a metal, Si, N and O, the insulating film being amorphous and containing a metal-N bond; and an electrode formed above the insulating film.

According to another aspect of the present invention, there is provided a method for manufacturing a semiconductor device comprising: forming an insulating film containing a metal, Si, N and O, above a substrate by an off axis sputtering method, the insulating film containing metal-N bonds larger than the sum total of metal-metal bonds and metal-Si bonds; and forming an electrode above the insulating film.

According to another aspect of the present invention, there is provided a method for manufacturing a semiconductor device comprising: forming a nitride film having a off-stoichiometric composition containing a metal and Si above a substrate by an off-axis sputtering method; oxidizing the nitride film to form an insulating film containing metal-N bonds larger than the sum total of metal-metal bonds and metal-Si bonds; and forming an electrode above the insulating film.

According to another aspect of the present invention, there is provided a method for manufacturing a semiconductor device comprising: forming an oxide film having a off-stoichiometric composition containing a metal and Si above a substrate by an off-axis sputtering method; nitriding the oxide film to form an insulating film containing metal-N bonds larger than the sum total of metal-metal bonds and metal-Si bonds; and forming an electrode above the insulating film.

According to another aspect of the present invention, there is provided a method for manufacturing a semiconductor device comprising forming a metal silicide film having a off-stoichiometric composition containing a metal and Si above a substrate by an off-axis sputtering method; oxynitriding the metal silicide film to form an insulating film containing metal-N bonds larger than the sum total of metal-metal bonds and metal-Si bonds; and forming an electrode on the insulating film.

DETAILED DESCRIPTION OF THE INVENTION

Figure 1:
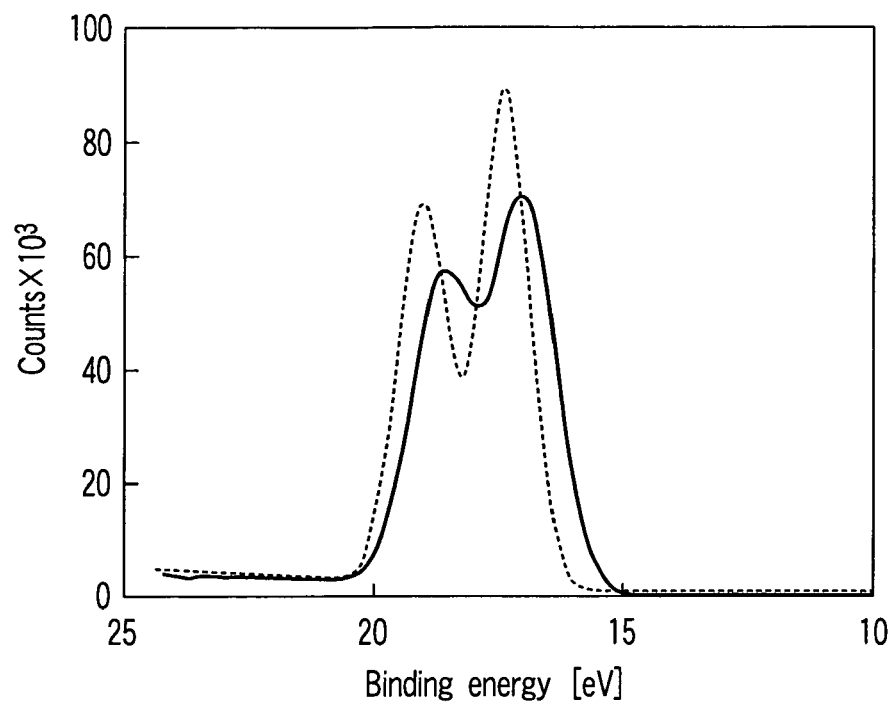
FIG. 1 is a graph showing the X-ray photoelectron spectroscopy (XPS) measurement results, that is, an Hf4f spectrum of an HfSiON film, according to one embodiment of the present invention.

Embodiments of the present invention will be explained with reference to the accompanying drawings.

As the results of intensive studies, the present inventors found that the leakage current increases when the both Hf and N concentrations of a conventional HfSiON film are simply increased for the reasons mentioned below.

The conventional HfSiON film is an insulator containing Si—N bonds, Si—O bonds, and Hf—O bonds. The composition is represented by the following formula.

$$(HfO_2)_x(SiO_2)_y(Si_3N_4)_{1-x-y}$$

where $0<x<1$ and $0<y<1$

Since N binds only to Si, when the concentration of N increases, the concentration of Si inevitably increases whereas the concentration of Hf decreases. Conversely, when the Hf concentration increases, the concentration of N decreases. In an attempt to increase both Hf and N concentrations of the HfSiON film, Hf—Hf bonds and Hf—Si bonds are naturally contained in addition to the Si—N bonds, Si—O bonds, and Hf—O bonds. However, because of the Hf—Hf bonds and the Hf—Si bonds being metallic bonds, when both Hf and N concentrations simply increase in a conventional HfSiON film, leakage current occurs.

When Hf—N bonds are present in an HfSiON film in addition to Si—N bonds, Si—O bonds, and Hf—O bonds, the composition of the film is expressed by the following formula:

$$(SiO_2)_{1-x}(Si_3N_4)_x)_{1-z}((HfO_2)_{1-y}(HfN_\alpha)_y)_z$$

where $0<x, y, z<1$, $\alpha=4/3$

In the HfSiON film having the aforementioned composition, the concentrations of Hf and N can be increased. In addition, it is found that Hf—N bonds, different from Hf—Hf bonds and Hf—Si bonds, do not increase the leakage current if they are contained in the film. However, to obtain the effect of the Hf—N bonds, Hf—N bonds need to be present larger than the sum total of the Hf—Hf bonds and Hf—Si bonds. It is more desirable that metallic bonds such as Hf—Hf bonds and Hf—Si bonds are not substantially present.

As a result, the concentrations of Hf and N were successfully increased without increasing the amount of leakage current, enabling the formation of a film having a high dielectric constant.

The HfSiON film containing a large number of Hf—N bonds can be formed by an off-axis sputtering method. In a general on-axis sputtering method, a sputtering target is arranged at a position facing a substrate, whereas, in an off-axis sputtering method, the sputtering target is arranged at a position not facing the substrate, more specifically, arranged at a position perpendicular to the substrate. With this arrangement, it is possible to prevent the invasion of highly accelerated ions and neutral atoms from a target into a film.

More specifically, in the on-axis sputtering method, the highly accelerated particles or ions enter a film almost at a right angle during film formation. Before bonds are sufficiently formed, next deposition takes place. In contrast, in the off-axis sputtering method, particles or ions do not enter the film. As a result, nitrogen ions are diffused into a film surface and bonded to not only Si but also Hf, thereby obtaining Hf—N bonds.

Since the formulation and the bonding state of ions are influenced by the difference in film formation mechanism, an HfSiON film containing Hf—N bonds can be formed by the off-axis sputtering method.

When forming an HfSiON film by the off-axis sputtering method, an HfSiON film can be formed directly on a substrate. To describe more specifically, HfSiON film can be formed by sputtering an $HfSi_xO_yN_z$ target (containing Hf—N bonds in an amount of 1% or more based on the total number of all bonds) in an Ar atmosphere or by sputtering an $HfSi_x$ target ($x>1$) in an atmosphere containing Ar, $N_2$ and $O_2$. Alternatively, the HfSiON film can be formed by sputtering, in a predetermined atmosphere, at least one target selected from Hf, $HfO_x$, $Hf_3N_4$ and $HfN_x$ ($x<2$) in combination with at least one target selected from Si, $SiO_x$ ($x<2$) and $SiN_x$ ($x<4/3$). The conditions of the sputtering are not limited as long as it is an off-axis sputtering.

When an HfSiON film is treated with heat, it is desirable that an antioxidant film is formed on the HfSiON film in advance. It is preferable that the antioxidant film is formed on the HfSiON film continuously right after the formation of the HfSiON film by using poly-Si, poly-Ge or a metal. When a transistor is formed by using the HfSiON film as a gate insulator, the antioxidant film can be used as a dummy gate, which thus may be removed after the heat treatment.

The HfSiON film may also be formed by depositing a nitride (HfSiN) film having a off-stoichiometric composition by an off-axis sputtering method, followed by oxidizing it. The HfSiN film having a off-stoichiometric composition can be oxidized by rapid thermal annealing (RTA), spike annealing at atmospheric pressure in an $O_2$ ambient, plasma oxidation, or radical oxidation. Alternatively, the HfSiON film may be formed by depositing an HfSiO film having a off-stoichiometric composition by an off-axis sputtering method, followed by nitriding it. Nitridation can be performed by rapid thermal nitridation (RTN), plasma nitridation, radical nitridation, or spike annealing in $N_2$ atmosphere. Furthermore, the HfSiON film may be formed by depositing an HfSi film having a off-stoichiometric composition by an off-axial sputtering method, followed by oxynitriding it. The oxynitridation process may be performed by heat treatment in NO gas.

When the off-stoichiometric HfSiN film is formed, a target formed of, for example, $HfSi_x$ or HfSiN may be used. Alternatively, sputtering may be performed in a predetermined atmosphere by using a target formed of Hf or HfN in combination with a target formed of Si or SiN.

When a off-stoichiometric HfSiO film is formed, a target formed of $HfSi_x$ ($x<1$) or $HfSi_xO_y$ ($x<1$ and $y<2$) may be used, or alternatively, a target made of Hf or $HfO_x$ may be used in combination with a target of Si or $SiO_x$ as a sputtering target.

In either case, the film having a off-stoichiometric composition need to be formed by sputtering in order to make oxidation proceed easily and lower the oxidation temperature to suppress the oxidation of an Si substrate. After an HfSiON film is formed, heat treatment is performed in vacuum, $O_2$, $N_2$, $H_2$, or $H_2/N_2$ atmosphere at a temperature of 450 to 1100° C., thereby repairing defects in the film to increase the film density. As a result leakage current can be suppressed and dielectric constant can be increased.

When an HfSi film having a off-stoichiometric composition is formed, a target formed of $HfSi_x$ (x<1) may be used. Alternatively, sputtering can be performed by using a target formed of Hf may be used in combination with a target formed of Si.

Now, an example in which an HfSiON film is formed by depositing an HfSiN film on a p-type Si (100) substrate by an off-axis sputtering method, followed by oxidizing the HfSiN film will be explained below.

A p-type Si (100) substrate was subjected to a common washing process (standard cleaning) performed with SC2 ($HCl/H_2O_2/H_2O$) and then to HF treatment. Subsequently, the substrate was washed with running pure water, dried and introduced into an off-axis sputtering apparatus.

In an off-axis sputtering apparatus, Hf target and Si targets were previously arranged individually with right angles to a substrate to be used. Into the off-axis sputtering apparatus, a p-type Si (100) substrate was introduced, the Hf and Si targets were sputtered in an Ar or $N_2$ atmosphere to obtain an HfSiN film having a off-stoichiometric composition.

The HfSiN film thus deposited was taken out in the air and then introduced into rapid thermal annealing (RTA) apparatus, in which RTA was performed at atmospheric pressure in an $O_2$ ambient, thereby forming an HfSiON film. The HfSiON film thus obtained was measured by X-ray electron spectroscopy (XPS) using AXIS-ULTRA sold by Kratos Analytical of Shimazu Group.

The obtained Hf4f spectrum is shown by a solid line in FIG. 1. For comparison, the Hf4f spectrum of an HfSiO film is shown by a broken line. In the spectrum of FIG. 1, the peaks of about 19.7 eV and 18.0 eV of the broken line exhibited the presence of Hf—O bonds. Since peaks of the solid line were present at points on slightly lower energy side of the peaks of the broken line, the presence of Hf—N bonds in the HfSiON film was identified. The fact that there were no peaks at about 13 eV and 15 eV clearly demonstrates that metallic bonds (Hf—Si bonds and Hf—Hf bonds) were not substantially present in the HfSiON film.

Since the detection limit of XPS is 1%, it was found that the concentration of the Hf—N bonds was 1% or more by molecular percentage. To suppress the crystallization of an HfSiON film, the concentration of Hf—N bonds must be 1% or more.

Furthermore, Rutherford Backscattering Spectroscopy (RBS) measurement demonstrated that the ratio of Hf/(Hf+Si) in the HfSiON film is about 47%. Since Hf—N bonds were formed, Hf was contained in a larger amount than a conventional case. As described, Hf—N bonds need to be contained in 1 atomic % or more and the ratio of Hf/(Hf+Si) is about 47%. Due to the ratio of Hf/(Hf+Si) being 47%, the HfSiON film has a dielectric constant of 15 or more. This is confirmed based on measurement of capacitance.

Figure 2:
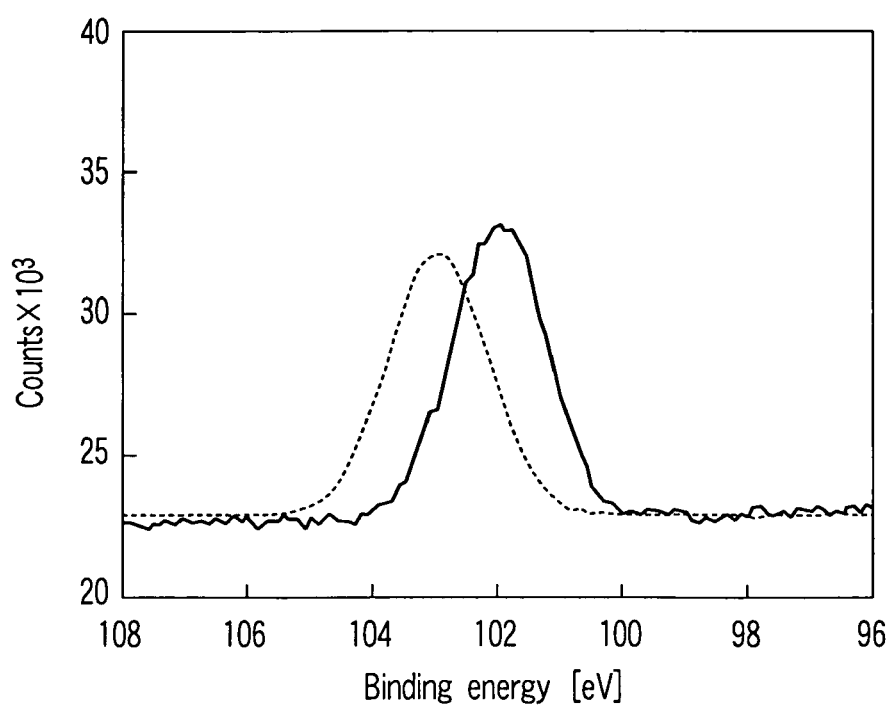
FIG. 2 is a graph showing the XPS measurement results, that is, an Si2p spectrum of the HfSiON film according to one embodiment of the present invention.

The Si2p spectrum of the same whole HfSiON film obtained by XPS measurement is shown in FIG. 2. In FIG. 2, the peak at about 103 eV revealed the presence of Si—O bonds. The peak at about 102 eV (at the lower energy side than 103 eV) revealed the presence of Si—N bonds. There was no peak at about 98 to 100 eV. This fact clearly demonstrates that no metallic bond (Si—Si bonds and Hf—Si bonds) substantially existed.

From the results of FIGS. 1 and 2, it was demonstrated that Hf—O, Si—O, Si—N, and Hf—N bonds are present in the HfSiON film. RBS measurement revealed that the content of N is 28.5 atomic % or more. The result measured by the XPS usually show content of each bonds of whole film.

Those spectrum peak of each bond may change depending on metal/(metal+Si) ratio of the film, therefore the position of binding energy of each bond in the film may be determined based on the metal/(metal+Si) ratio of the film and positions of binding energies of Hf-o bond and Si—O bond of the film having the metal/(metal+Si) ratio.

The spectrum peaks may also be measured by Energy Dispersive X-ray Fluorescence Spectrometer (EDX) or by Electron Energy Loss Spectroscopy (EELS).

Figure 3:
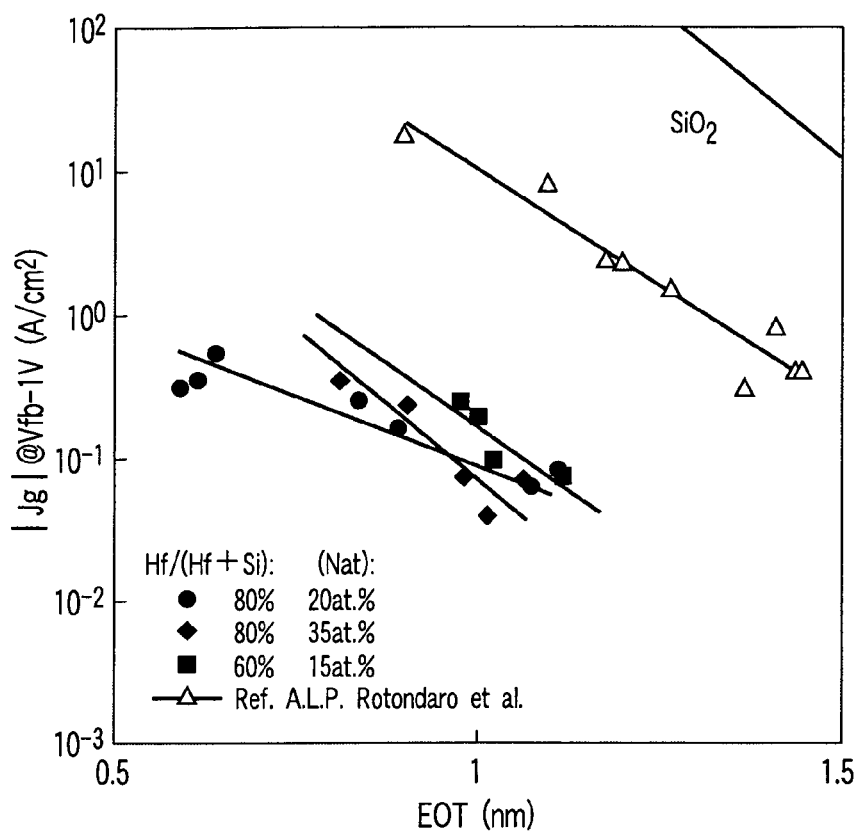
FIG. 3 is a graph showing the relationship between equivalent oxide thickness (EOT) of an HfSiON film and Jg where Vg=Vfb−1(V)

The graph of FIG. 3 shows the relationship between the equivalent oxide thickness (EOT) of an HfSiON film and the leakage current density Jg at Vg=Vfb−1(V) where Vg is a gate voltage and Vfb is a flat band voltage. The graph also shows trend lines for an $SiO_2$ film and a conventional HfSiON film (indicated as Ref.) based on the results previously reported.

From the graph of FIG. 3, leakage current (Jg) tends to increase as EOT decreases. The leakage current (Jg) is lower than that of $SiO_2$ by not less than four orders of magnitude and lower than the conventional HfSiON film (Ref.) by about two orders of magnitude. This is considered due to the ratio of Hf/(Hf+Si) of the conventional HfSiON film (Ref.) being as low as about 40%. In particular, the leakage current from the HfSiON film having about 0.6 nm thick (in terms of EOT) was reduced by about five orders of magnitude compared to that of the $SiO_2$ film.

It has not been identified that Hf—N bonds are present in a conventional HfSiON film formed by an on-axis sputtering method. To confirm this, an HfSiON film was formed by an on-axis sputtering method in the same manner as described above except that Si and Hf targets were arranged at the positions facing a substrate.

The HfSiON film thus obtained was subjected to XPS measurement. As a result, Hf—N bonds were not detected but detected a large number of metallic bonds such as Hf—Hf bonds and Hf—Si bonds. At this time, the ratio of Hf/(Hf+Si) in the HfSiON film was about 39% and the content of N was about 25 atomic %. Since the ratio of Hf/(Hf+Si) is about 39%, the dielectric constant of the HfSiON film remains about 13.

As described, in the HfSiON film having no Hf—N bonds, large leakage current is generated due to the presence of a large number of metallic bonds, and crystallization occurs due to insufficient N content. Furthermore, the dielectric constant is limited due to in sufficient Hf content.

Since the HfSiON film of the embodiment of the present invention does not substantially contain metallic bonds but contain Hf—N bonds, Hf and N are contained in considerably large amounts compared to a conventional HfSiON film. Therefore, it becomes possible to increase a dielectric constant, suppress crystallization and reduce leakage current.

Figure 4:
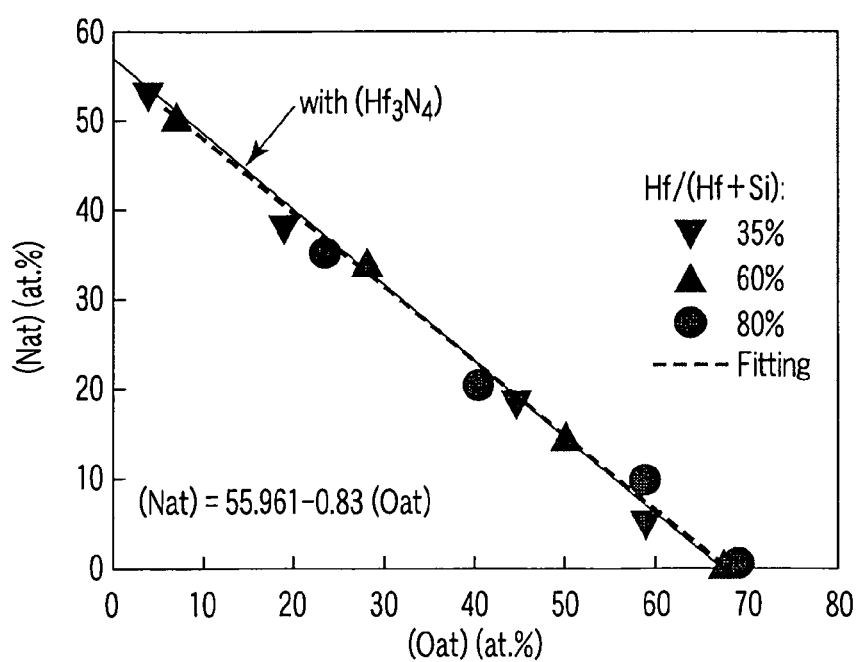
FIG. 4 is a graph showing the relationship between the oxygen atomic percentage ($O_{at}$) and nitrogen atomic percentage ($N_{at}$) of an HfSiON film.

The graph of FIG. 4 shows the relationship between oxygen atomic percent ($O_{at}$) and nitrogen atomic percent ($N_{at}$) in the HfSiON films. As is shown in the figure, although the HfSiON films differ in ratio of Hf/(Hf+Si), the oxygen atomic ratio and the nitrogen atomic ratio are approximately distributed along a straight line. In other words, ($O_{at}$) and ($N_{at}$) satisfy the relationship represented by formula (1) below:

$$2(O_{at}) + 3(N_{at}) = 4((Si_{at}) + (Hf_{at})) \qquad (1)$$

with the proviso that $(O_{at})$ and $(N_{at})$ satisfy the relationship represented by formula (2) below:

$$(O_{at})+(N_{at})+(Si_{at})+(Hf_{at})=100 \quad (2)$$

On the assumption that $(Hf_{at})$ is zero, this relationship satisfied by $(O_{at})$ and $(N_{at})$ will be equal to that of SiON film having a stoichiometric composition. In the case of SiON film, Si having 4 coordinations to N (3 coordinations) or O (2 coordinations). Therefore, if $(Hf_{at})$ is 0, the SiON film satisfies the condition represented by the formula (1).

Hence, the SiON can be regarded as a pseudo-binary alloy (S. V. Hattangady et al., J. Vac. Sci. Technol. A14, 3017 (1996)) represented by formula (3).

$$(SiO_2)_x(Si_3N_4)_{1-x} \quad (3)$$

From formula (1), the HfSiON film according to the embodiment of the present invention is considered as the same as stoichiometric SiON whose Si is partially replaced with Hf. On the analogy of pseudo-binary alloy model represented by formula (3) of an SiON film, the HfSiON film can be expressed by a pseudo-quaternary alloy represented by formula (4) below:

$$(HfO_2)_x(SiO_2)_{1-x})_z(Hf_3N_4)_y(Si_3N_4)_{1-y})_{1-z} \quad (4)$$

where 0<x, y, z<1

In formula (4), x and y are variables expressing degrees of freedom of O and N in preferentially binding to either Hf or Si.

If HfSiON is expressed by formula (4), Hf—N bonds have a nature of the short-range order of $Hf_3N_4$. This is the point to be especially notified. It is well known that HfN is a metal. When HfN is a metal, Hf and N are present in the ratio of 1:1. However, When HfN is present in the ratio of Hf:N=3:4, that is, $Hf_3N_4$, is not a metal but an insulating material (B. O. Johnson et al., J. Mater. Res. 1, 442 (1986); P. Kroll, Phys. Rev. Lett. 90, 125,501 (2003)).

On the assumption that the HfSiON film according to the embodiment of the present invention contains an alloy of $Hf_1N_1$, the HfSiON film should be present at the lower side of $Hf_3N_4$ in FIG. 4. However, actually, the HfSiON film is distributed approximately along the line indicated by $Hf_3N_4$ satisfying formula (4). From this fact, the Hf—N bonds contained in the HfSiON film may be said as the same dielectric bonds as $Hf_3N_4$.

Further note that, simply because Hf satisfies formula (4), it cannot be said that Hf has the same four coordinations as Si. This is because the numbers of valences of N and O may also change in accordance with Hf. More specifically, if Hf has X coordination (X is 4 to 8), O and N are set at X/2 coordination and 3X/4 coordination, respectively, there is no discrepancy in formula (4).

Figure 5:
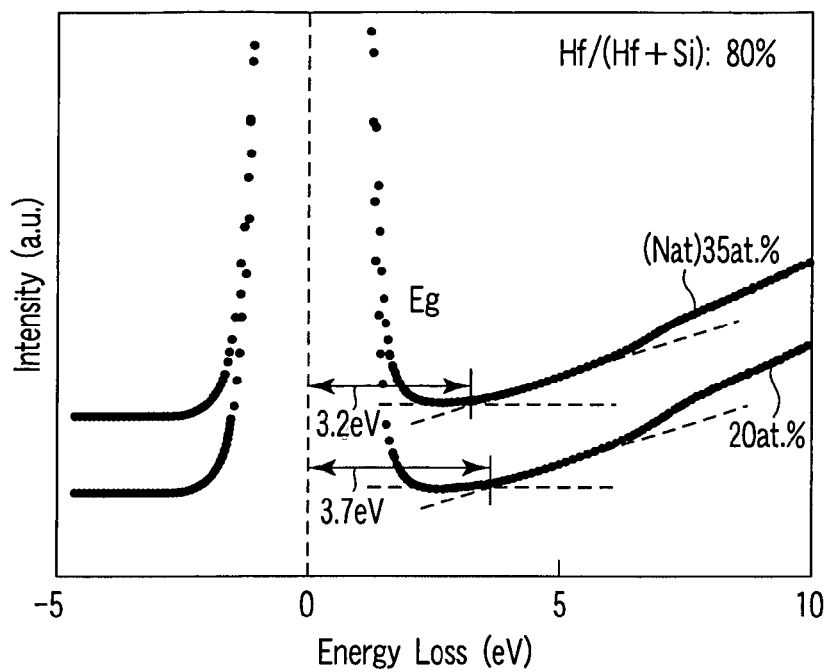
FIG. 5 is a graph showing a band gap of an HfSiON film.

Next, the band gap Eg of an HfSiON film was examined by Reflection Electron Energy Loss Spectroscopy (REELS). The results are shown in FIG. 5.

Since the ratio of Hf/(Hf+Si) is 80%, and a value $(N_{at})$ is as high as 20 and 35%, a large number of Hf—N bonds are present in the HfSiON film. When the Hf—N bond is a metallic bond, the band gap approximates zero. Actually, the band gap of the film is about 3 eV or more. Therefore, it was confirmed that the Hf—N bonds contained in an HfSiON film according to the present invention are not metallic bonds but dielectric bonds such as $Hf_3N_4$.

An HfSiON film according to the embodiment of the present invention may be formed on a Si substrate via an interface layer. When the interface layer is formed substantially thin so as not to increase the substantial thickness of the entire structure, it is possible to enhance the performance of a transistor.

Furthermore, it is not always necessary for such an HfSiON film to have a uniform composition in the thickness direction. A larger number of Hf—N bonds may be present both surfaces of the HfSiON film. This case is favorable since the interface layer can be made thinner.

Figure 6:
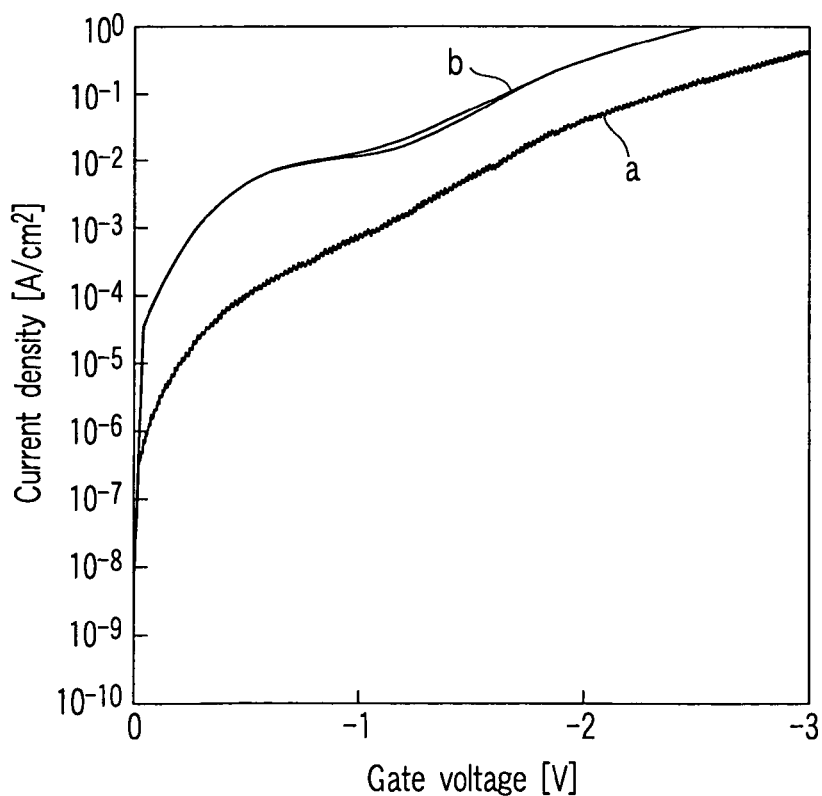
FIG. 6 is a graph showing the relationship between voltage and leakage current.

Using the HfSiON film formed by the off-axis sputtering method as mentioned above, a structure composed of an Au electrode, an HfSiON film, and p—Si (100) was formed and its electric characteristics were checked. The relationship between the leakage current and the voltage of the HfSiON film is shown in the graph of FIG. 6, in which curve "a" shows the results of the HfSiON film containing N in an amount of 52%, and the ratio of Hf/(Hf+Si) is 47%. For comparison, in FIG. 6, curve "b" indicates the relationship between the leakage current and the voltage of an $SiO_2$ film.

The HfSiON film and the $SiO_2$ film were formed with an effective thickness of 2 nm. The term "effective thickness" refers to the electric thickness of the HfSiON film estimated by regarding the dielectric constant of the $SiO_2$ film as 3.9. From the results shown in the graph of FIG. 6, it is found that the current flowing the HfSiON film is lower than that of $SiO_2$ film by one to two orders of magnitude at all voltage values. When an electric field of 5 MV/cm is applied to the HfSiON film, the leakage current of the HfSiON film becomes lower than that of $SiO_2$ film by two orders of magnitude.

As already explained in the above, in a conventional HfSiON film containing no Hf—N bonds, it has been impossible to sufficiently increase its Hf concentration and reduce the leakage current. In contrast, in the HfSiON film according to the embodiment of the present invention, since Hf—N bonds are contained larger than metallic bonds, the concentration of Hf can be increased. Therefore, leakage current can be decreased while maintaining a high dielectric constant. This advantage is achieved for the first time by the present invention.

Figure 7:
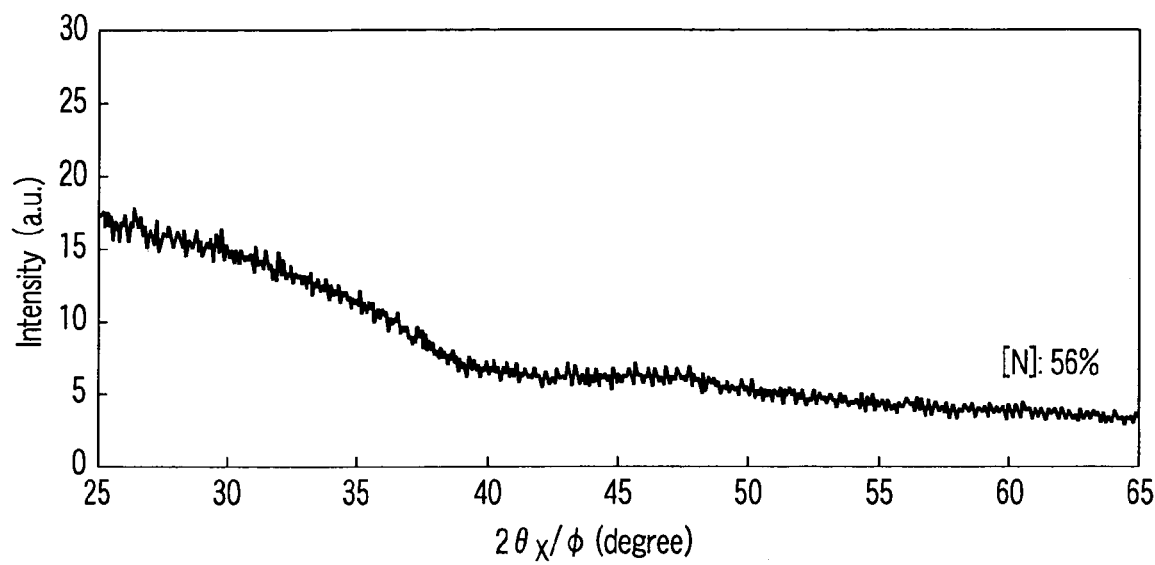
FIG. 7 is a graph showing an in-plane x-ray diffraction (XRD) pattern of an HfSiON film according to one embodiment of the present invention.

Similarly, the state of the HfSiON film formed by an off-axis sputtering method was checked by in a plain x-ray diffraction (in plain XRD) method. The results are shown in FIG. 7. Since the XRD pattern shown in FIG. 7 shows no peak. This fact means that no crystallization occurs. From this, it is demonstrated that the crystallization of HfSiON film is suppressed. The HfSiON film remains in an amorphous state without being crystallized even after the heat treatment performed at a high temperature of 1,000° C. or more.

Figure 8:
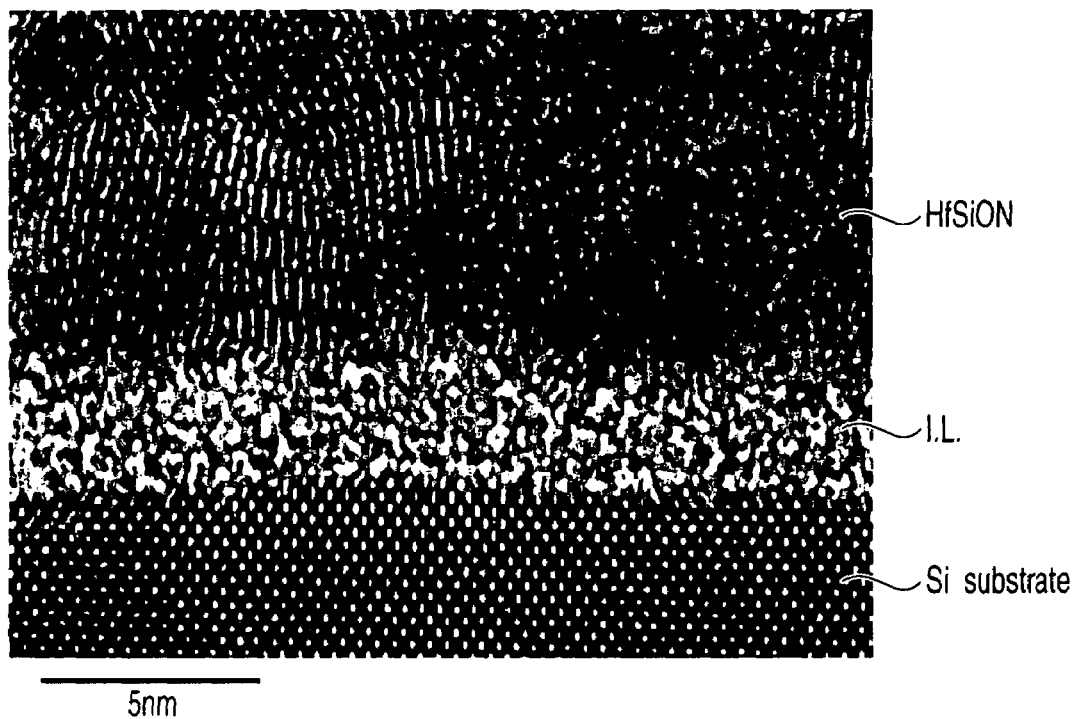
FIG. 8 is a transmission electron microscope (TEM) image showing a sectional view of an HfSiON film after heat treatment.
Figure 9:
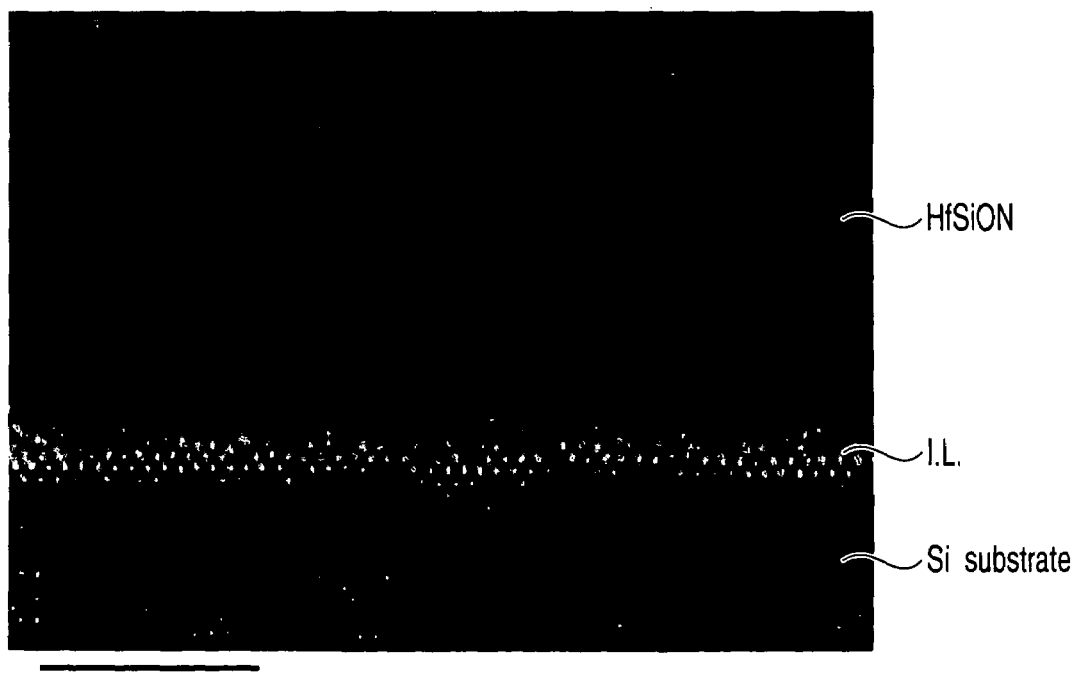
FIG. 9 is a TEM image showing a cross-section view of another HfSiON film after heat treatment.

FIGS. 8 and 9 show TEM images showing a cross-section of an HfSiON film after the heat treatment.

In the HfSiON film shown in FIG. 8, the ratio of Hf/(Hf+Si) is 55% and a value of $(N_{at})$ is 38 atomic %. The film was treated with heat without an antioxidation film provided thereon. On the other hand, in the HfSiON film shown in FIG. 9, the ratio of Hf/(Hf+Si) is 60% and a value of $(N_{at})$ is 33 atomic %. The film was treated with heat with an antioxidation film provided thereon.

FIG. 8 shows a crystallized HfSiON film. An interface layer of about 5 nm thick is observed between the Si substrate and the interface. In contrast, FIG. 9 shows a non-crystallized HfSiON film. The interface layer formed between the Si substrate and the HfSiON film is up to about 1 nm.

Figure 10:
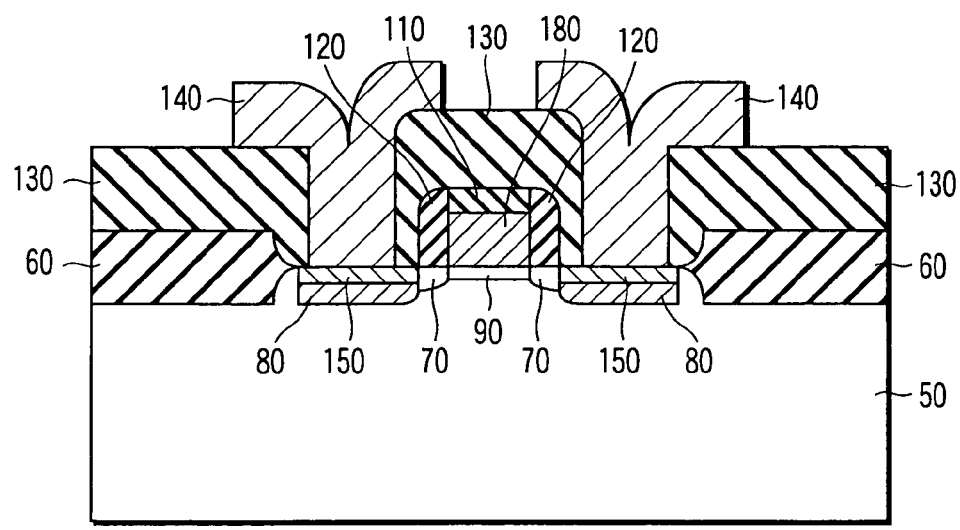
FIG. 10 is a sectional view of a semiconductor device according to one embodiment of the present invention.

FIG. 10 shows a cross-section of an example of a semiconductor device, an MOS transistor, according to one embodiment of the present invention. The semiconductor device of embodiment of the present invention is not limited to the MOS transistor and SOI and a vertical transistors may be used.

In the MOS transistor shown in the figure, the isolation region 60 formed of a silicon thermal oxide is formed on a p-type silicon substrate 50, thereby forming the active region. A source/drain diffusion regions 70, 80 doped with phosphorus as an impurity are separately formed. Note that the substrate is not limited to bulk silicon. Any substrate may be used as long as its channel region is formed of Si, Ge, SiGe or a compound semiconductor.

On the surface of the p-type silicon substrate 50 sandwiched by the source and drain diffusion regions, a gate insulting film 90 of HfSiON is formed by the method mentioned above and further a gate electrode 180 constituted by a polycrystalline silicon film is formed by a CVD method. On the gate electrode 180, a silicon oxide film 110 is formed by the CVD method. On the sidewall of the gate electrode 180, a silicon nitride film 120 is arranged. The gate electrode 180 may be formed of a metal such as TiN, Au, Al, Pt or Ag.

Impurities are activated by annealing to form the source and drain diffusion regions 70 and 80. The annealing is performed in an atmosphere of an inert gas such as $N_2$, Ar, or He, or vacuum.

Although it is not shown, the gate electrode 180 and the source/drain diffusion regions 70 and 80 may be overlapped with each other. In this case, in the overlapped region, a film such as an $SiO_2$, $Si_3N_4$ or SiON film having a lower dielectric constant than an HfSiON film may be formed.

On the isolation region 60 and silicon oxide film 110, the interlayer insulating film 130 formed of a silicon oxide film is arranged. On the source and drain diffusion region, an aluminum electrode 140 serving as wiring is formed via a silicide film 150. Such a structure is formed as follows. A silicon oxide film is formed over the entire surface of the substrate 50 having the isolation region 60 and the silicon oxide film 110 to form the interlayer insulating film 130. Subsequently, a contact hole is formed and then an aluminum film is deposited by sputtering, followed by patterning it.

The MOS transistor shown in FIG. 10 has a gate insulating film 90 formed of an HfSiON film containing Hf—N bonds in a larger amount than that of metallic bonds. Because of this, even if a high temperature process of 1,000° C. or more is performed, the resultant MOS transistor showed good operation while the leakage current of the gate insulating film is suppressed low.

The HfSiON film containing Hf—N bonds larger than metallic bonds can be used as the insulating film between gate electrodes, a tunnel insulating film of nonvolatile memory device and the gate insulating film of a CMOS transistor. In these cases, the same effects can be obtained. Furthermore, when the HfSiON film is used as a capacitor insulating film of a capacitor, the substantial film thickness thereof can be reduced while suppressing the leakage current.

In the foregoing, a nitrogen-containing metal silicate film has been explained by way of an example of an HfSiON film. However, the present invention is not limited to the HfSiON film. The same discussion can be applied to a ZrSiON film and the same effects can be obtained. Furthermore, when Hf is replaced with a lanthanoide series element such as La, Ce, Pr, Nd, Pm, Sm, Eu, Gd, Tb, Dy, Ho, Er, Tm, Yb or Lu, a nitrogen-containing metal silicate film having the same effect can be obtained.

As explained in the foregoing, according to the present invention, it is possible to provide a semiconductor device having an insulating film formed of a nitrogen-containing metal silicate film which is capable of suppressing the crystallization of a film, having a sufficiently high dielectric constant, and reduced in leakage current lower than an oxide film, and further provide a method for manufacturing the semiconductor device.

The present invention makes it possible to improve the reliability of a semiconductor device such as an MOS transistor and bring an extraordinary industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate;
   an insulating film formed above the substrate and including a metal, Si, N and O, the insulating film including metal-N bonds, the metal-N bonds distributed throughout the thickness of the insulating film in an amount of 1 atomic % or more; and
   an electrode formed above the insulating film.

2. The semiconductor device according to claim 1, wherein a content of the metal in the insulating film is 47 atomic % or more based on the total amount of the metal and Si.

3. The semiconductor device according to claim 1, wherein the metal included in the insulating film comprises at least one selected from the group consisting of Zr, Hf and lanthanoide series metals.

4. The semiconductor device according to claim 3, wherein the metal comprises Hf, and the insulating film includes Si–O, Si–N, Hf–O and Hf–N bonds.

5. The semiconductor device according to claim 4, wherein the insulating film has the composition represented by formula below:

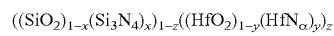

where $0<x, y, z<1$, $\alpha=4/3$.

6. The semiconductor device according to claim 1, wherein the substrate has impurity diffusion regions separately formed and the insulating film comprises a gate insulating film formed between the impurity diffusion regions, and the electrode comprises a gate electrode.

7. A semiconductor device comprising:
   a substrate;
   an insulating film formed above the substrate and including a metal, Si, N and O, the insulating film being amorphous and including metal-N bonds, the metal-N bonds distributed throughout the thickness of the insulating film in an amount of 1 atomic % or more; and
   an electrode formed above the insulating film.

8. The semiconductor device according to claim 7, wherein the metal contained in the insulating film comprises at least one selected from the group consisting of Zr, Hf and lanthanoide series metals.

9. The semiconductor device according to claim 8, wherein the metal comprises Hf and the insulating film includes Si—O, Si—N, Hf—O, and Hf—N bonds.

10. The semiconductor device according to claim 9, wherein the insulating film has the composition represented by formula below:

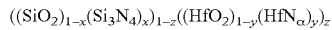

where $0<x, y, z<1$, $\alpha=4/3$.

11. A semiconductor device comprising:
a semiconductor substrate comprising a channel region;
an insulating film formed above the channel region of the semiconductor substrate and including a metal, Si, N and O, the insulating film having a spectrum peak at a bonding energy of a metal-N bond and including metal-N bonds, the metal-N bonds distributed throughout the thickness of the insulating film in an amount of 1 atomic % or more;
a gate electrode formed above the semiconductor substrate; and
a pair of source/drain regions sandwiching the channel region of the semiconductor substrate.

12. The semiconductor device of claim 11, wherein the insulating film has no spectrum peak at a bonding energy of a metal-metal bond.

13. The semiconductor device of claim 11, wherein the insulating film has other spectrum peaks at binding energies of a metal-O bond, a Si—O bond and a Si—N bond, and the insulating film has no other spectrum peak(s) at a binding energy.

* * * * *